United States Patent
Li et al.

(10) Patent No.: US 10,043,699 B2
(45) Date of Patent: Aug. 7, 2018

(54) HIGH CAPACITY OVERHEAD TRANSPORT (OHT) RAIL SYSTEM WITH MULTIPLE LEVELS

(71) Applicant: Taiwan Semiconductor Manufacturing Co., Ltd., Hsin-Chu (TW)

(72) Inventors: Fu-Hsien Li, Taichung (TW); Chi-Feng Tung, Jhunan Township (TW); Hsiang Yin Shen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 59 days.

(21) Appl. No.: 14/940,467

(22) Filed: Nov. 13, 2015

(65) Prior Publication Data

US 2017/0140966 A1 May 18, 2017

(51) Int. Cl.
| | |
|---|---|
| *H01L 21/677* | (2006.01) |
| *B25J 11/00* | (2006.01) |
| *B61B 13/04* | (2006.01) |
| *B65G 1/04* | (2006.01) |

(52) U.S. Cl.
CPC ..... *H01L 21/67766* (2013.01); *B25J 11/0095* (2013.01); *B61B 13/04* (2013.01); *B65G 1/0464* (2013.01); *H01L 21/6773* (2013.01); *H01L 21/67733* (2013.01); *B65G 2201/0297* (2013.01)

(58) Field of Classification Search
CPC ................ H01L 21/6773; B65G 2201/0297
USPC ............... 414/278, 222.01, 267, 940, 744.5
See application file for complete search history.

(56) References Cited

U.S. PATENT DOCUMENTS

| | | | | |
|---|---|---|---|---|
| 7,891,929 | B2* | 2/2011 | Yamamoto | B65G 47/5104 414/281 |
| 8,308,418 | B2* | 11/2012 | Ma | B65G 37/02 198/347.4 |
| 2013/0213257 | A1* | 8/2013 | Yamamoto | H01L 21/6773 105/150 |
| 2014/0112741 | A1* | 4/2014 | Yoshioka | H01L 21/67359 414/222.01 |
| 2015/0332948 | A1* | 11/2015 | Ikeda | B66C 19/00 700/230 |
| 2016/0090239 | A1* | 3/2016 | Iwasaki | H01L 21/67733 414/267 |

* cited by examiner

Primary Examiner — Anna M Momper
Assistant Examiner — Ronald P Jarrett
(74) Attorney, Agent, or Firm — Eschweiler & Potashnik, LLC

(57) ABSTRACT

An overhead transport (OHT) system with multiple levels of rails for the transport of semiconductor workpieces is provided. A first vehicle is configured to travel on, and move a semiconductor workpiece along, a first rail. A second vehicle is configured to travel on, and move the semiconductor workpiece along, a second rail overlying the first rail. A controller is configured to control the first and second vehicles to transfer the semiconductor workpiece along the first and second rails, between process or inspection tools. A method for transferring semiconductor workpieces across multiple levels of rails is also provided.

20 Claims, 10 Drawing Sheets

HIGH CAPACITY OVERHEAD TRANSPORT (OHT) RAIL SYSTEM WITH MULTIPLE LEVELS

BACKGROUND

During the bulk manufacture of integrated circuits (ICs), workpieces are repeatedly processed at multiple process and inspection tools to gradually build the ICs. Due to the use of multiple tools, transporting the workpieces between the tools is important to quickly and efficiency bulk manufacture the ICs. According to some transport systems, workpieces are transported by overhead transport (OHT) vehicles that travel on rails. The OHT vehicles may be configured to raise the workpieces off of loading ports of the tools, to laterally move the workpieces along the rails, and/or to lower the workpieces on to the loading ports of the tools.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
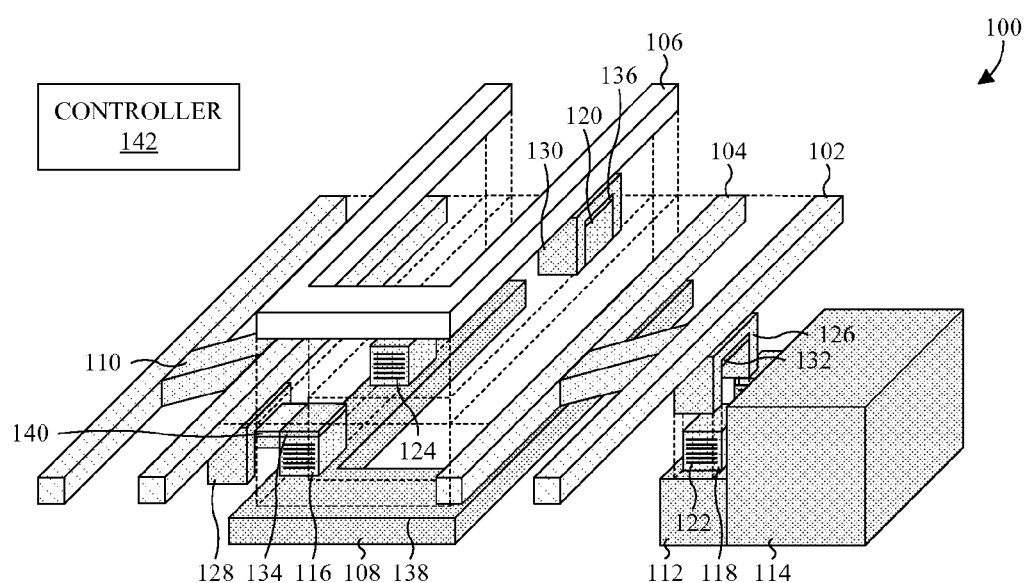
FIG. 1 illustrates a perspective view of some embodiments of an overhead transport (OHT) system with multiple levels of rails.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some overhead transport (OHT) systems for the transport of semiconductor workpieces comprise a single level rail design with one or more coplanar rail loops. For example, such OHT systems may comprise two or more coplanar, concentric rail loops. The coplanar rail loop(s) are interconnected by bridges extending laterally between the rail loops, and carry OHT vehicles configured to move workpieces along the rail loop(s) between process and/or inspection tools that underlie or otherwise neighbor the rail loop(s).

One challenge with the single level rail design is that it doesn't scale well. When expanding the single layer rail design to accommodate additional process and/or inspection tools, additional rail loops are added outward since there is limited space inward. For example, there may be insufficient space for bridges when adding an interior loop. Accordingly, the footprint of the single level rail design increases substantially (e.g., by about 65%) for each additional rail loop. Further, adding additional rail loops substantially increases the length of rail that workpieces may traverse when moving between process and/or inspection tools. Another challenge with the single level rail design is that the speed of OHT vehicles decreases substantially (e.g., by about 30%) when moving between rail loops on the bridges. Yet another challenge with the single level rail design is that it may be unable to keep up with high throughput process and inspection tools, such as high throughput lithography and/or etch process tools. Such high throughput tools are expected to become increasingly common with next generation process nodes, such as 10 nanometer process nodes and beyond.

The present application is directed towards an OHT transport system with multiple levels of rails. In accordance with some embodiments, a first OHT vehicle is configured to move a workpiece along a first rail and to transfer the workpiece laterally to an underlying storage buffer. A second OHT vehicle is configured to receive the workpiece from the storage buffer and to move the workpiece along a second rail that overlies the first rail. By using multiple levels of rails, the OHT transport system advantageously achieves high capacity and low transfer times. Further, high throughput process and inspection tools achieve good utilization and the footprint of the OHT transport system is small.

With reference to FIG. 1, a perspective view 100 of some embodiments of an OHT transport system with multiple levels of rails 102, 104, 106 is provided. As illustrated, first rails 102, 104 border a storage buffer 108 at a first level above the storage buffer 108, and a second rail 106 overlies the storage buffer 108 at a second level above the storage buffer 108 that is greater than the first level. The first rails 102, 104 are interconnected by bridges 110 extending laterally between neighboring first rails 102, 104, and at least one of the first rails 102, 104 overlies a loading port 112 of a process and/or inspection tool 114. The second rail 106 is arranged laterally between the first rails 102, 104 and, in some embodiments, directly over the storage buffer 108 with a smaller footprint than that of the storage buffer 108.

The storage buffer 108 is configured to store workpiece carriers 116, 118, 120. In some embodiments, the storage buffer 108 is static. In other embodiments the storage buffer 108 is a conveyor belt configured to store the workpiece carriers 116, 118, 120 while moving the workpiece carriers 116, 118, 120 along an upper surface of the conveyer belt. The workpiece carriers 116, 118, 120 are configured to store one or more workpieces 122, 124 upon which ICs are built and may be, for example, front opening unified pods (FOUPs) or standard mechanical interface (SMIF) pods.

OHT vehicles 126, 128, 130 are arranged on the first and second rails 102, 104, 106, and are configured to move the workpiece carriers 116, 118, 120 along respective rails 102, 104, 106. For example, first OHT vehicles 126, 128 may be configured to move first workpiece carriers 116, 118 below the first rails 102, 104, and a second OHT vehicle 130 may be configured to move a second workpiece carrier 120 below the second rail 106. The OHT vehicles 126, 128, 130 are also configured to move the workpiece carriers 116, 118, 120 between the first and second rails 102, 104, 106 and the storage buffer 108.

In some embodiments, the OHT vehicles 126, 128, 130 comprise grippers 132, 134, 136 configured to extend and retract to grab and/or release the workpiece carriers 116, 118, 120 so the workpiece carriers 116, 118, 120 may be moved into and/or out of the OHT vehicles 126, 128, 130. The OHT vehicles 126, 128, 130 may, for example, be configured to laterally extend and retract the grippers 132, 134, 136, and/or to vertically extend and retract the grippers 132, 134, 136 (e.g., in a direction orthogonal to an upper surface 138 of the storage buffer 108). Further, the grippers 132, 134, 136 may, for example, be extended laterally with arms 140 (e.g., mechanical and/or robotic arms) and/or vertically with cables (not shown).

A controller 142 is electrically coupled or otherwise operatively coupled to the OHT vehicles 126, 128, 130 and, in some embodiments, the storage buffer 108. The controller 142 is configured to coordinate the transfer of the workpiece carriers 116, 118, 120 to and from the loading port 112 of the process and/or inspection tool 114. For example, the controller 142 may be configured to control the transfer of a workpiece carrier to the loading port 112 of the process and/or inspection tool 114 from another process and/or inspection tool (not shown).

While the OHT transport system was described with two different levels of rails, it is to be appreciated that the OHT transport system may have three or more different levels of rails. In some of such embodiments, the rails define respective loops and dimensions of the loops (e.g., width and/or length) decrease with level. For example, a loop at the uppermost or highest level may have a smallest width and/or length, while a loop at the bottommost or lowest level may have a largest width and/or length. Further, while the first level is described as having multiple first rails, it is to be appreciated that the first level may be limited to a single rail.

By using multiple levels of rails, the OHT transport system advantageously achieves high capacity and low transfer times between process and/or inspection tools. Further, high throughput process and/or inspection tools achieve good utilization and the footprint of the OHT transport system is small.

Figure 2:
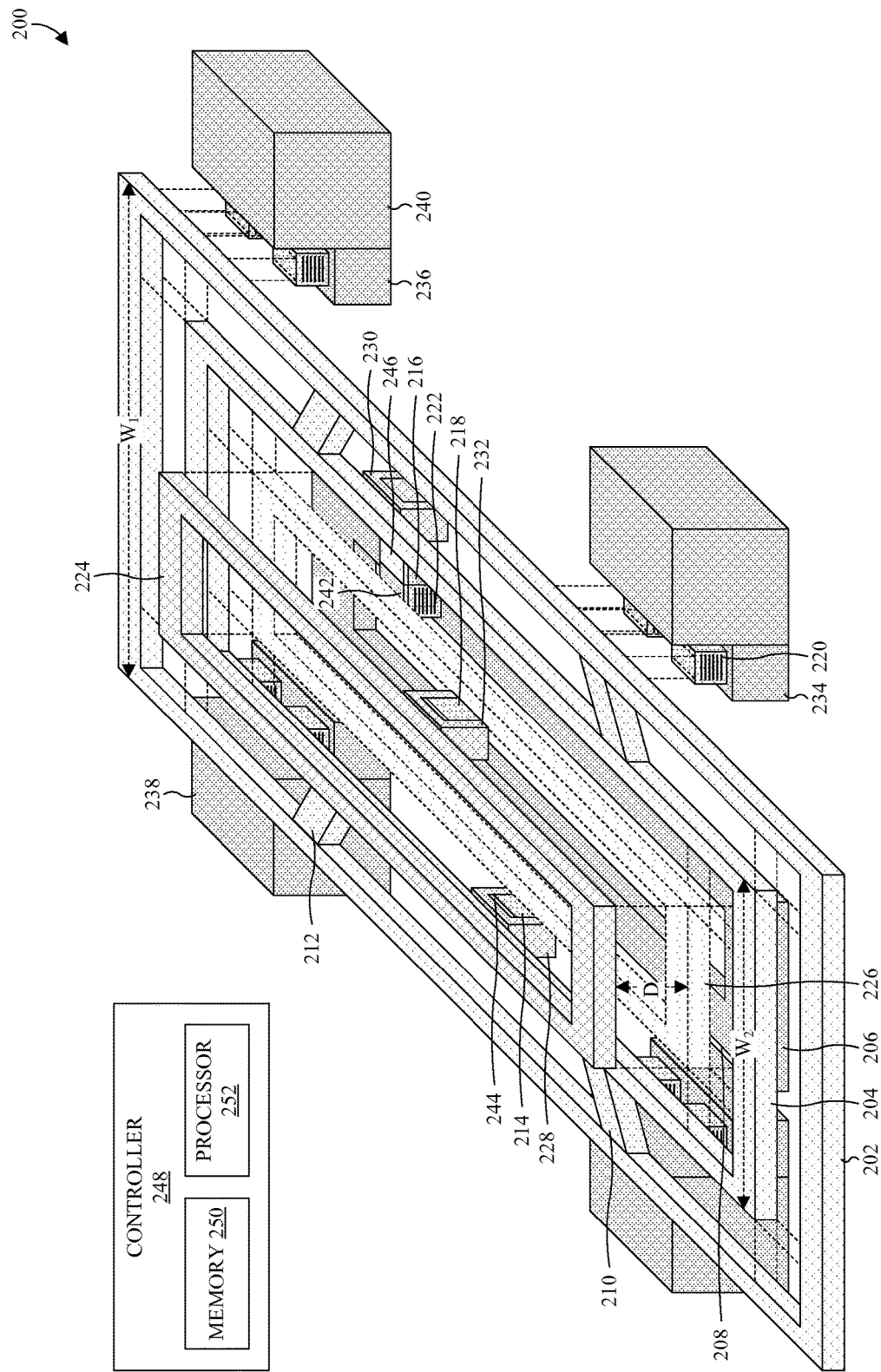
FIG. 2 illustrates a more detailed perspective view of some embodiments of an OHT system with multiple levels of rails.

With reference to FIG. 2, a more detailed perspective view 200 of some embodiments of an OHT transport system with multiple levels of rails is provided. The OHT transport system may, for example, correspond to embodiments of the OHT transport system in FIG. 1. As illustrated, one or more first rails 202, 204 border a storage buffer 206 at a first level above the storage buffer 206. The first rail(s) 202, 204 extend laterally in a common plane (e.g., a plane parallel to an upper surface 208 of the storage buffer 206) and enclose respective areas. For example, the first rail(s) 202, 204 may have loop-shaped or ring-shaped footprints enclosing the areas. In some embodiments, the first rail(s) 202, 204 are limited to a single rail. In other embodiments, the first rail(s) 202, 204 comprise an outer rail 202 laterally surrounding an inner rail 204 in the common plane. The outer rail 202 may, for example, have a width $W_1$ of about 2.7 meters and the inner rail 204 may, for example, have a width $W_2$ of about 2.0 meters. Where the first rail(s) 202, 204 comprise multiple rails, one or more bridges 210, 212 extend laterally between neighboring first rails 202, 204 to interconnect the first rail(s) 202, 204.

The storage buffer 206 is arranged below the first rail(s) 202, 204 and is configured to store workpiece carriers 214, 216, 218. The workpiece carriers 214, 216, 218 are configured to store one or more workpieces 220, 222 upon which ICs are built and may be, for example, FOUPs or SMIF pods. The workpieces 220, 222 may be, for example, semiconductor substrates, such as bulk silicon wafers. In some embodiments, the storage buffer 206 is static. In other embodiments, the storage buffer 206 is a conveyor belt configured to store the workpiece carriers 214, 216, 218 while moving the workpiece carriers 214, 216, 218. The storage buffer 206 may extend laterally to enclose an area, such that the storage buffer 206 may, for example, have a loop-shaped or ring-shaped footprint.

A second rail 224 overlies the storage buffer 206 at a second level above the storage buffer 206 that is greater than the first level. In other words, the second rail 224 is arranged a greater distance from the storage buffer 206 than the first rail(s) 202, 204, along an axis orthogonal to the upper surface 208 of the storage buffer 206, such that the second rail 224 is spaced from the first rail(s) 202, 204 by a distance D. For ease of understanding, a phantom 226 of the second rail 224 is shown at the first level. The phantom 226 is not to be construed as a physical component or element of the OHT transport system. The second rail 224 is further arranged laterally between the first rail(s) 202, 204 and, in some embodiments, directly over the storage buffer 206 with a smaller footprint than that of the storage buffer 206. The second rail 224 extends laterally to enclose an area, such that the second rail 224 may, for example, have a loop-shaped or ring-shaped footprint.

OHT vehicles 228, 230, 232 are arranged on the first and second rails 202, 204, 224, and configured to move the workpiece carriers 214, 216, 218 along respective rails between loading ports 234, 236 of respective process and/or inspection tools 238, 240. For example, first OHT vehicles 228, 230 may be configured to move first workpiece carriers 214, 216 along the first rail(s) 202, 204, and a second OHT vehicle 232 may be configured to move a second workpiece carrier 218 along the second rail 224. The loading ports 234, 236 underlie the first rail(s) 202, 204 and, in some embodiments, directly underlie at least one of the first rail(s) 202, 204. The loading ports 234, 236 correspond to shelves or tables and are configured to support the workpiece carriers 214, 216, 218. The process and/or inspection tools 238, 240 are configured to perform semiconductor manufacturing or inspection processes on the workpieces 220, 222 of the workpiece carriers 214, 216, 218 to bulk manufacture ICs on the workpieces 220, 222. The process and/or inspection tools 238, 240 may comprise, for example, high throughput etch or lithography process tools or vapor deposition process tools.

To move the workpiece carriers 214, 216, 218 into and out of the OHT vehicles 228, 230, 232, the OHT vehicles 228, 230, 232 are further configured to laterally extend and retract respective grippers 242, 244 and/or to extend the respective grippers 242, 244 in a direction orthogonal to the upper surface 208 of the storage buffer 206. The OHT vehicles 228, 230, 232 may, for example, use arms 246 and/or cables (not shown) to extend the grippers 242, 244. The grippers 242, 244 are configured to grip or otherwise latch onto the workpiece carriers 214, 216, 218 so the workpiece carriers 214, 216, 218 may be moved into and/or out of the OHT vehicles 228, 230, 232. For example, a gripper 242 of an OHT vehicle 230 may extend laterally outward towards a workpiece carrier 216 and grip the workpiece carrier 216. Thereafter, the gripper 242 may retract back into the OHT vehicle 230 to move the workpiece carrier 216 into the OHT vehicle 230. In some embodiments, the grippers 242, 244 are or otherwise include forks with fingers configured to latch onto the workpiece carriers 214, 216, 218.

A controller 248 is electrically coupled or otherwise operatively coupled to the OHT vehicles 228, 230, 232 and, in some embodiments, the storage buffer 206 to move the workpiece carriers 214, 216, 218 between the process and/or inspection tools 238, 240. For example, the controller 248 may be configured to control the lateral motion of the OHT vehicles 228, 230, 232 along the first and second rails 202, 204, 224, as well as the grippers 242, 244 of the OHT vehicles 228, 230, 232 for automatically moving the workpiece carriers 214, 216, 218 into and out of the OHT vehicles 228, 230, 232. The controller 248 may implement the foregoing functionality by hardware, software, or a combination of the two. For example, the controller 248 may comprise a memory 250 configured to store software implementing the foregoing functionality, and may further comprise a processor 252 configured to execute the software to perform the foregoing functionality. The memory 250 may comprise for example, FLASH memory or some other non-transitory medium, and the processor may comprise, for example, a microprocessor or some other device configured to execute software instructions.

While the OHT transport system was described with two different levels of rails, it is to be appreciated that the OHT transport system may have three or more different levels. For example, suppose N>2 levels stacked upon one another with the bottommost level being the first level and the topmost level being the Nth level. Each level i may have (N−i)+1 rails, where each of the rails at the level i are coplanar. Further, with exception of the rail at the Nth level, the one or more rails at each level i laterally enclose respective areas with loop-shaped or ring-shaped footprints and laterally enclose the one or more rails at the i+1 level.

Figure 3A:
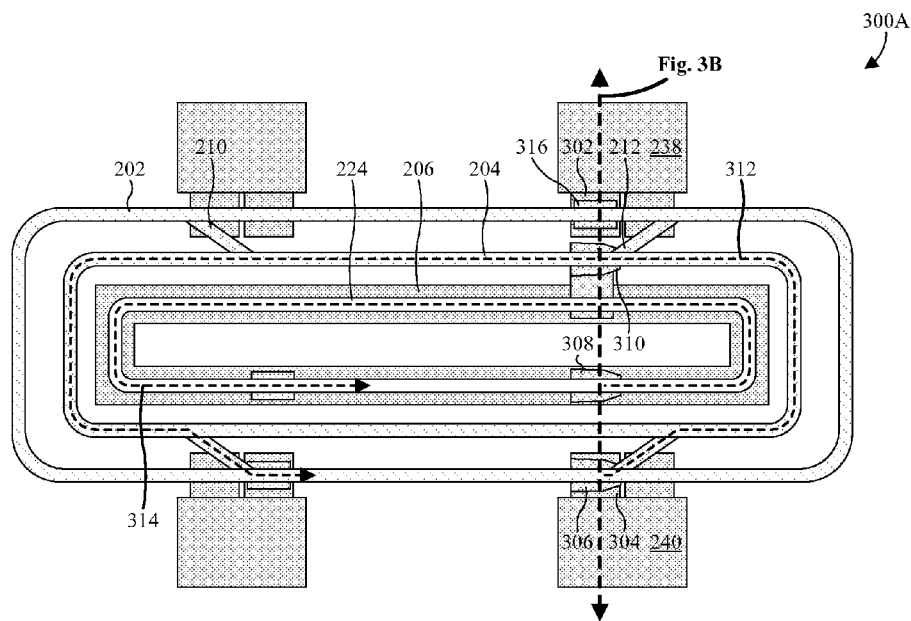
FIG. 3A illustrates a top view of some embodiments of an OHT system with multiple levels of rails.

With reference to FIG. 3A, a top view 300A of some embodiments of an OHT transport system with multiple levels of rails is provided. The OHT transport system may, for example, correspond to embodiments of the OHT transport system in FIG. 2. As illustrated, first rails 202, 204 are arranged at a first level above a storage buffer 206 and extend laterally to enclose to the storage buffer 206. The first rails 202, 204 extends laterally in a common plane, and may have, for example, loop-shaped profiles. An outer rail 202 of the first rails 202, 204 encloses an inner rail 204 of the first rails 202, 204, and directly overlies loading ports 302, 304 of respective process and/or inspection tools 238, 240. The process and/or inspection tools 238, 240 may each be associated with a single loading port or multiple individual loading ports. The inner rail 204 of the first rails 202, 204 is laterally spaced between the storage buffer 206 and the outer rail 202 of the first rail 202, 204. Further, one or more bridges 210, 212 extend laterally between the first rails 202, 204 to interconnect the first rails 202, 204.

A second rail 224 is arranged over the storage buffer 206 at a second level above the storage buffer 206 that exceeds the first level. Further, the second rail 224 is laterally enclosed by the first rails 202, 204. In some embodiments, the second rail 224 is arranged directly over the storage buffer 206 and/or has a smaller footprint than the storage buffer 206.

OHT vehicles 306, 308, 310 are arranged on the first and second rails 202, 204, 224, and configured to move laterally along the first and second rails 202, 204, 224. For example, a first OHT vehicle 306 may be configured to move on the first rails 202, 204 along a first path 312, such that the first OHT vehicle 306 moves between the first rails 202, 204 using the bridge(s) 210, 212. As another example, a second OHT vehicle 308 may be configured to move on the second rail 224 along a second path 314. The OHT vehicles 306, 308, 310 are configured to transport workpiece carriers 316 between the loading ports 302, 304 of the process and/or inspection tools 238, 240 by, among other things, moving the workpiece carriers 316 laterally along the first and second rails 202, 204, 224.

Figure 3B:
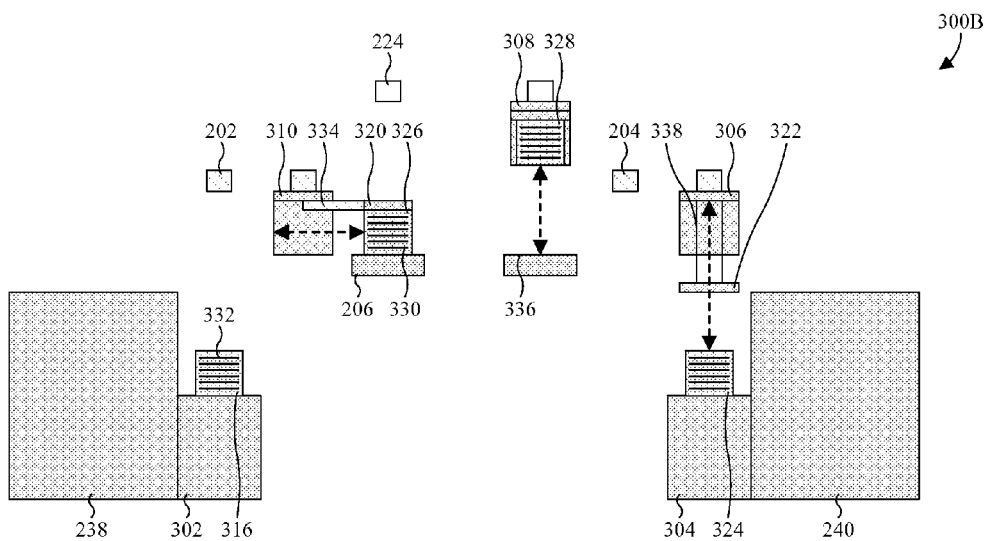
FIG. 3B illustrates a cross-sectional view of some embodiments of the OHT system of FIG. 3A.

With reference to FIG. 3B, a cross-sectional view 300B of some embodiments of the OHT transport system of FIG. 3A is provided. The OHT vehicles 306, 308, 310 are further configured to extend and retract respective grippers 320, 322 to move workpiece carriers 316, 324, 326, 328 into and out of the OHT vehicles 306, 308, 310. The grippers 320, 322 are configured to grip or otherwise latch onto the workpiece carriers 316, 324, 326, 328, and the workpiece carriers 316, 324, 326, 328 comprise respective stacks of workpieces 330, 332 and may be, for example, FOUPs or SMIF pods.

In some embodiments, the OHT vehicles 306, 308, 310 are configured to laterally extend and retract the grippers 320, 322 using respective arms 334 to move the workpiece carriers 316, 324, 326, 328 into and out of the OHT vehicles 306, 308, 310. For example, an OHT vehicle 310 may laterally extend a gripper 320 to a workpiece carrier 326, grab the workpiece carrier 326 with the gripper 320, and retract the gripper 320 to move the workpiece carrier 326 into the OHT vehicle 310. Further, in some embodiments, the OHT vehicles 306, 308, 310 are configured to extend and retract the grippers 320, 322 along an axis orthogonal to an upper surface 336 of the storage buffer 206 using arms or cables 338 to move the workpiece carriers 316, 324, 326, 328 into and out of the OHT vehicles 306, 308, 310. For example, an OHT vehicle 306 may lower a gripper 322 to a workpiece carrier 324, grab the workpiece carrier 324, and retract the gripper 322 to move the workpiece carrier 324 into the OHT vehicle 306.

With reference to FIGS. 4, 5A, 5B, 6, 7, 8A, 8B, 9, 10, 11A, 11B, and 12, a series of top and cross-sectional views of some embodiments of an OHT system is provided. The OHT system may, for example, correspond to embodiments of the OHT system of FIGS. 3A & 3B. The series of top and cross-sectional views illustrate a method for transferring a workpiece between loading ports of respective tools, across multiple levels of rails.

Figure 4:
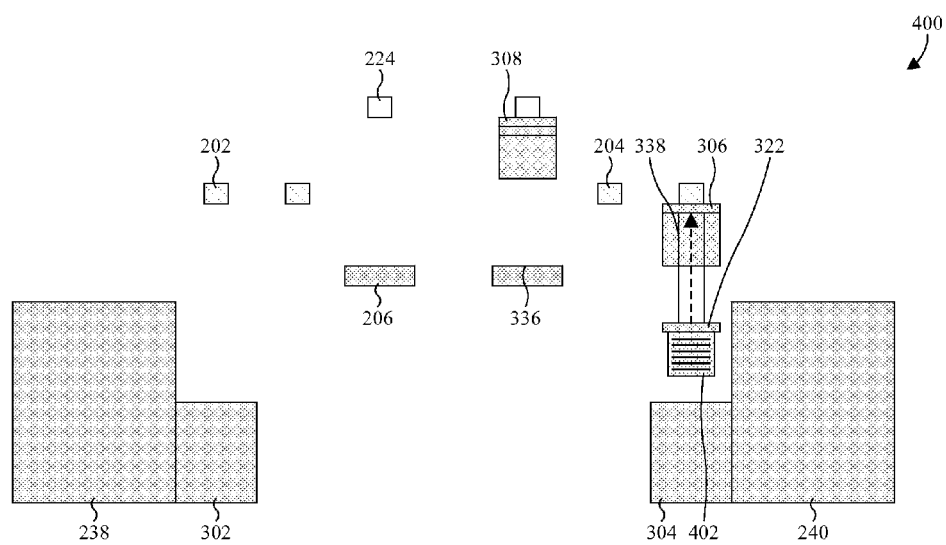
FIGS. 4, 5A, 5B, 6, 7, 8A, 8B, 9, 10, 11A, 11B, and 12 illustrate a series of top and cross-sectional views of some embodiments of a method for transferring a workpiece between loading ports of respective tools, across multiple levels of rails.

As illustrated by the cross-sectional view 400 of FIG. 4, a workpiece carrier 402 is transferred into a first OHT vehicle 306 by a respective gripper 322. For example, the first OHT vehicle 306 moves on first rails 202, 204 to a location directly over the workpiece carrier 402. The gripper 322 of the first OHT vehicle 306 is then lowered onto the workpiece carrier 402 using one or more arms and/or cables 338. The gripper 322 grabs or otherwise latches on to the workpiece carrier 402 and is retracted back up to the first OHT vehicle 306.

Figure 5A:
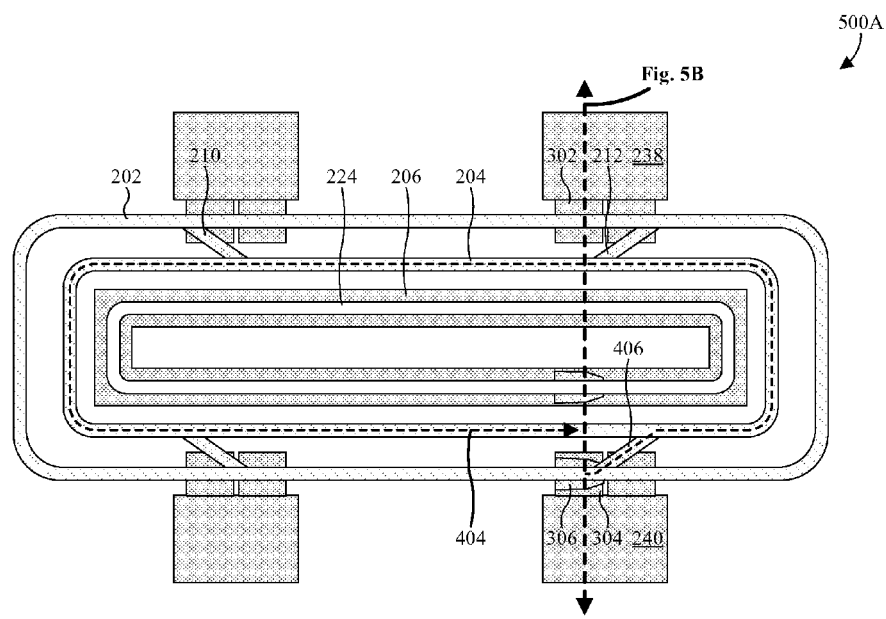
Figure 5B:
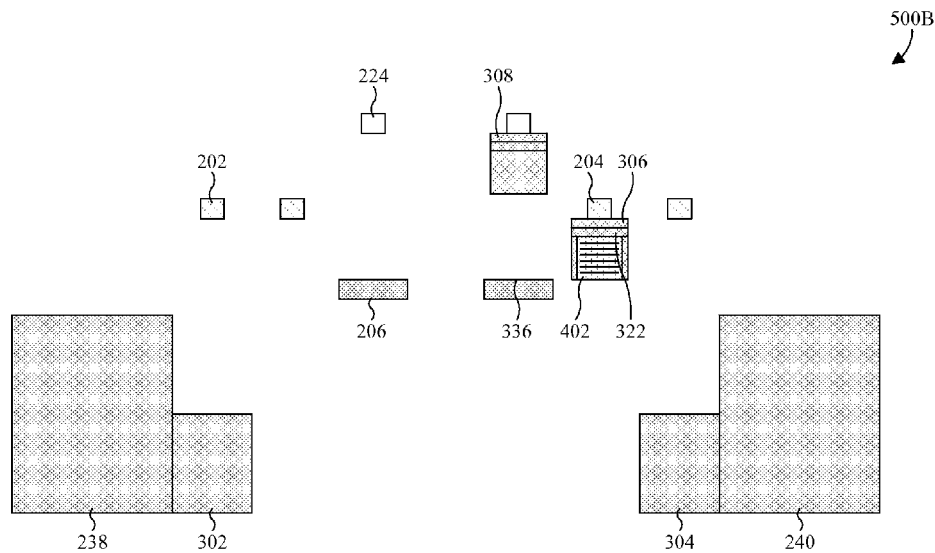

As illustrated by the top and cross-sectional views 500A, 500B respectively of FIGS. 5A and 5B, the first OHT vehicle 306 moves the workpiece carrier 402 on the first rails 202, 204 along a first path 404 to a target location neighboring a storage buffer 206. For example, the first OHT vehicle 306 moves along an outer rail 202 of the first rails 202, 204 to a first bridge 406 between the outer rail 202 of the first rails 202, 204 and an inner rail 204 of the first rails 202, 204. The first OHT vehicle 306 moves to the inner rail 204 of the first rails 202, 204 along the bridge 406, and subsequently to the target location along the inner rail 204 of the rails 202, 204.

Figure 6:
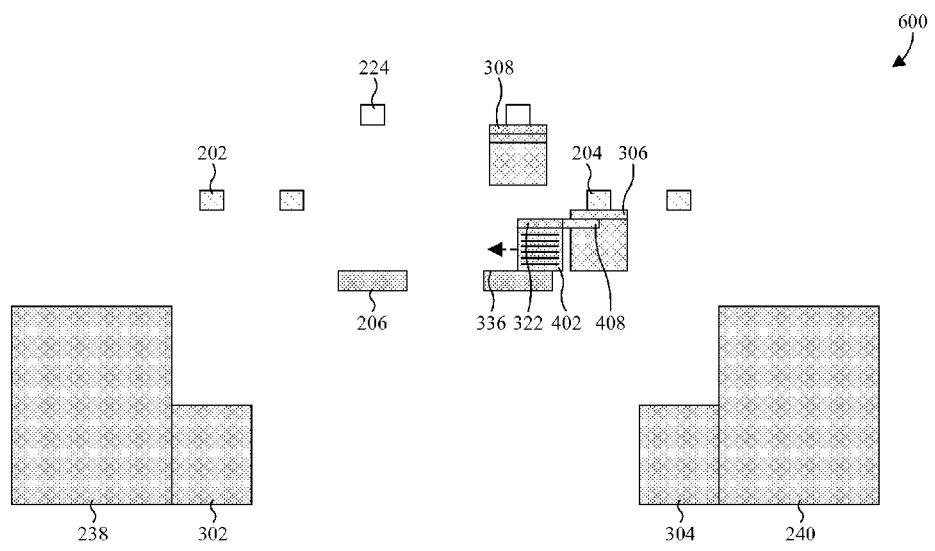

As illustrated by the cross-sectional view 600 of FIG. 6, the workpiece carrier 402 is transferred out of the first OHT vehicle 306 to the storage buffer 206 by the gripper 322 of the first OHT vehicle 306. For example, the gripper 322 of the first OHT vehicle 306 and the workpiece carrier 402 are extended laterally to a location overlying the storage buffer 206 by an arm 408 of the first OHT vehicle 306. The gripper 322 of the first OHT vehicle 306 then releases the workpiece carrier 402 and is retracted back into the first OHT vehicle 306 by the arm 408 of the first OHT vehicle 306.

Figure 7:
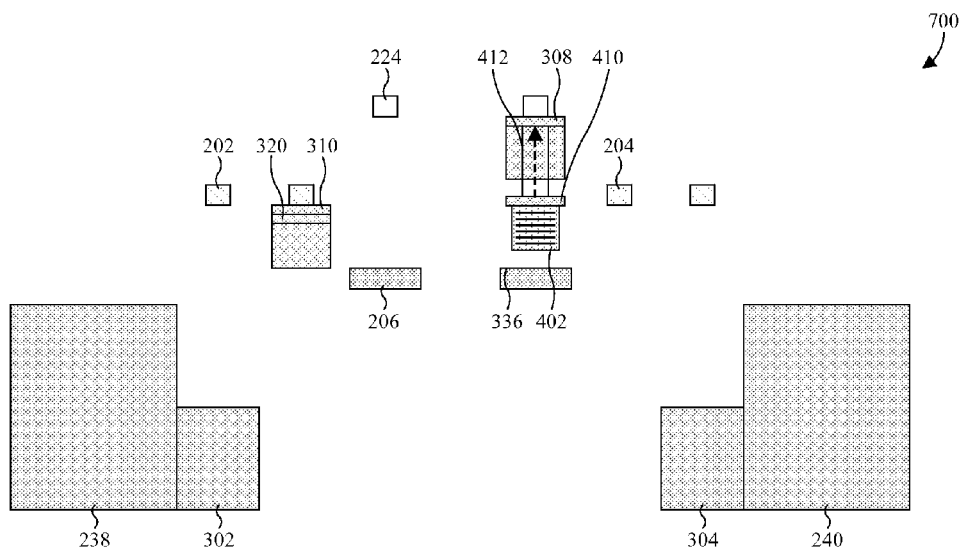

As illustrated by the cross-sectional view 700 of FIG. 7, the workpiece carrier 402 is transferred into a second OHT vehicle 308 by a respective gripper 410. For example, the second OHT vehicle 308 moves on a second rail 224 overlying the first rails 202, 204 and the storage buffer 206 to a location directly over the workpiece carrier 402. The gripper 410 of the second OHT vehicle 308 is then lowered onto the workpiece carrier 402 using one or more arms and/or cables 412 of the second OHT vehicle 308. The gripper 410 of the second OHT vehicle 308 attaches to the workpiece carrier 402 and is retracted back up to the second OHT vehicle 308.

Figure 8A:
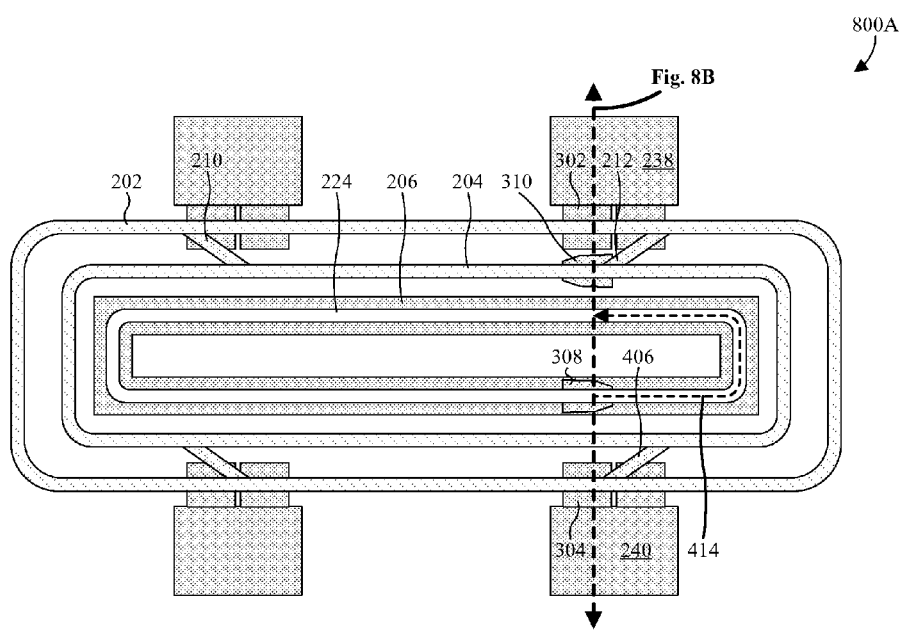
Figure 8B:
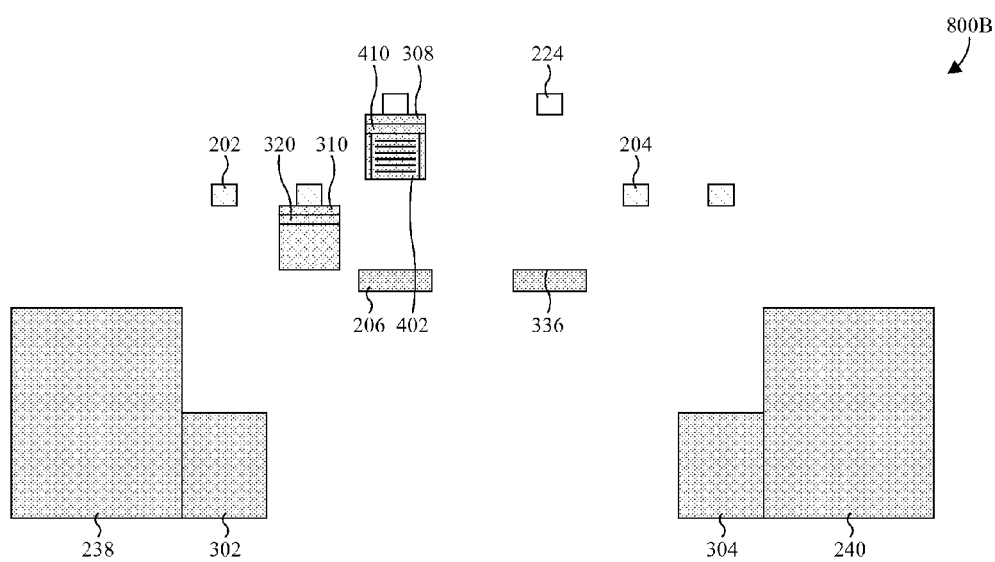

As illustrated by the top and cross-sectional views 800A, 800B respectively of FIGS. 8A and 8B, the second OHT vehicle 308 moves the workpiece carrier 402 laterally on the second rail 224 along a second path 414 to a target location on the second rail 224.

Figure 9:
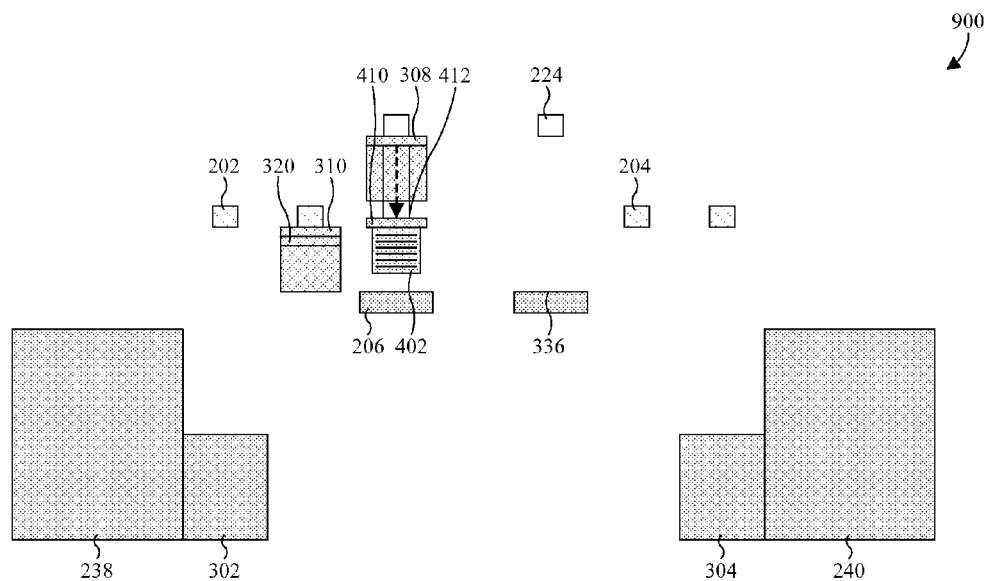

As illustrated by the cross-sectional view 900 of FIG. 9, the workpiece carrier 402 is transferred out of the second OHT vehicle 308 to the storage buffer 206 by the gripper 410 of the second OHT vehicle 308. For example, the gripper 410 of the second OHT vehicle 308 is lowered to the storage buffer 206 with the workpiece carrier 402 using the arm(s) and/or cable(s) 412 of the second OHT vehicle 308. The gripper 410 of the second OHT vehicle 308 then releases the workpiece carrier 402 and retracts back into the second OHT vehicle 308.

Figure 10:
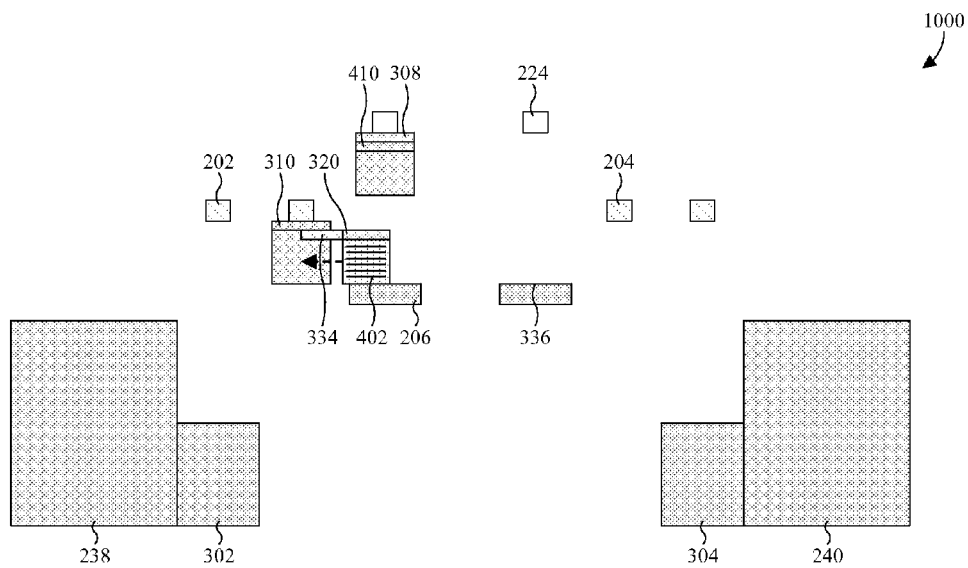

As illustrated by the cross-sectional view 1000 of FIG. 10, the workpiece carrier 402 is transferred from the storage buffer 206 to a third OHT vehicle 310 by a respective gripper 320 of the third OHT vehicle 310. For example, the gripper 320 of the third OHT vehicle 310 is extended laterally to the workpiece carrier 402 using an arm 334 of the third OHT vehicle 310. The gripper 320 of the third OHT vehicle 310 then grabs the workpiece carrier 402 and retracts back into the third OHT vehicle 310. In some embodiments, the third OHT vehicle 310 is the first OHT vehicle 306 (see, e.g., FIG. 4).

Figure 11A:
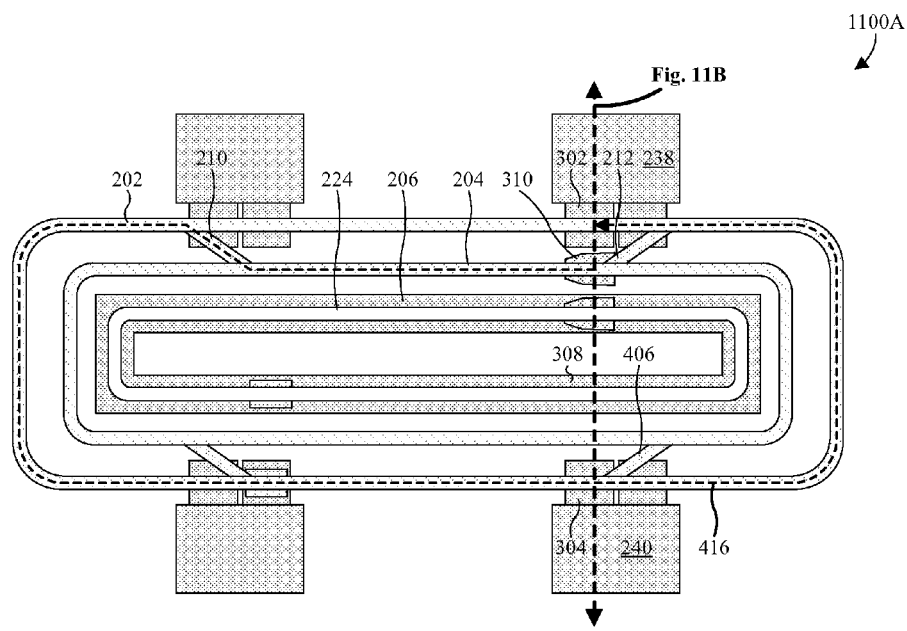
Figure 11B:
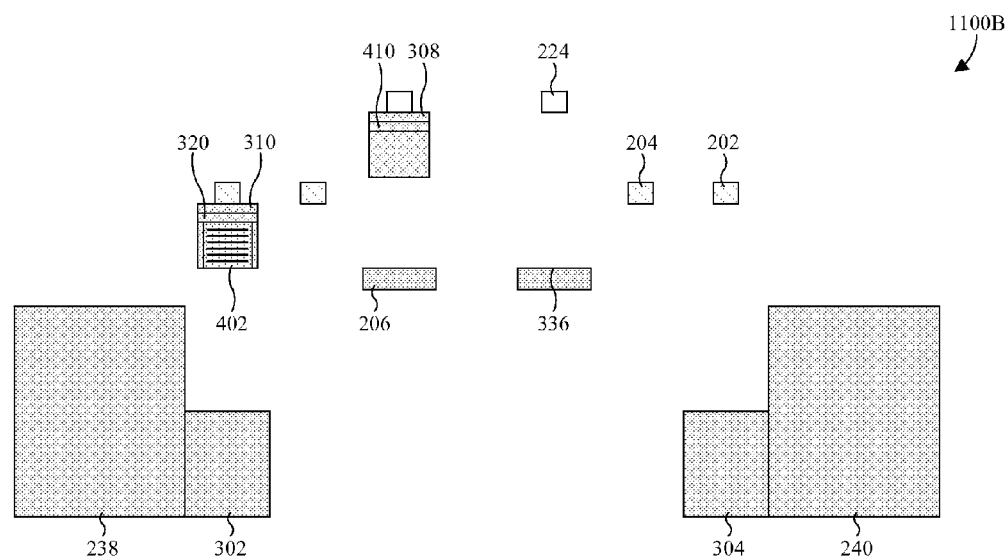

As illustrated by the top and cross-sectional views 1100A, 1100B respectively of FIGS. 11A and 11B, the third OHT vehicle 310 moves the workpiece carrier 402 laterally on the first rails 202, 204 along a third path 416 to a target location directly over a loading port 302 of a second process and/or inspection tool 238. For example, the third OHT vehicle 310 moves along the inner rail 204 of the first rails 202, 204 to a second bridge 210 between the outer rail 202 of the first rails 202, 204 and an inner rail 204 of the first rails 202, 204. The third OHT vehicle 310 moves to the outer rail 202 of the first rails 202, 204 along the second bridge 210, and subsequently to the target location along the outer rail 202 of the first rails 202, 204.

Figure 12:
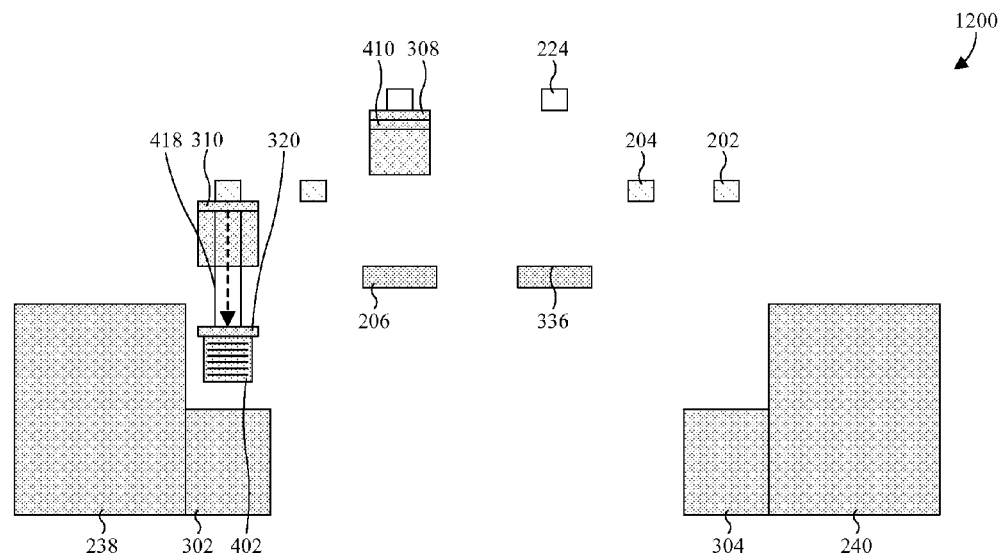

As illustrated by the cross-sectional view 1200 of FIG. 12, the workpiece carrier 402 is transferred to a loading port 302 of a second process and/or inspection tool 238 by the gripper 320 of the third OHT vehicle 310. For example, the gripper 320 of the third OHT vehicle 310 is lowered onto the loading port 302 with the workpiece carrier 402 using one or more arms and/or cables 418 of the third OHT vehicle 310. The gripper 320 of the third OHT vehicle 310 detaches from the workpiece carrier 402 and is retracted back up to the third OHT vehicle 310.

Figure 13:
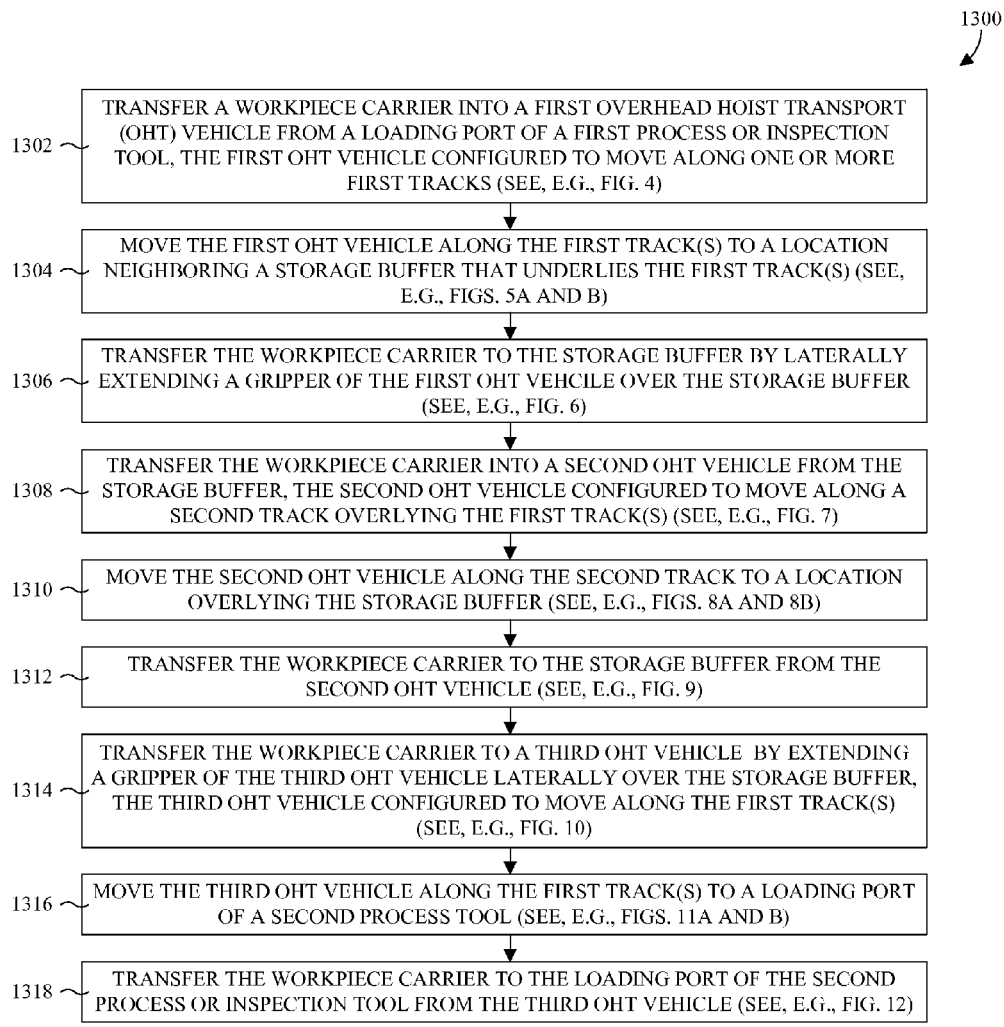
FIG. 13 illustrates a flowchart of some embodiments of a method for transferring a workpiece between loading ports of respective tools, across multiple levels of rails.

With reference to FIG. 13, a block diagram of some embodiments of a method for transferring a workpiece between loading ports of respective process and/or inspection tools, across multiple levels of rail, is provided.

At 1302, a workpiece carrier is transferred into a first OHT vehicle from a loading port of a first process and/or inspection tool, where the first OHT vehicle is configured to move along one or more first tracks. See, e.g., FIG. 4.

At 1304, the first OHT vehicle moves along the first track(s) to a location neighboring a storage buffer that underlies the first track(s). See, e.g., FIGS. 5A and 5B.

At 1306, the workpiece carrier is transferred to the storage buffer by laterally extending a gripper of the first OHT vehicle over the storage buffer. See, e.g., FIG. 6.

At 1308, the workpiece carrier is transferred into a second OHT vehicle from the storage buffer, where the second OHT vehicle is configured to move along a second track overlying the first track(s). See, e.g., FIG. 7.

At 1310, the second OHT vehicle moves along the second track to a location overlying the storage buffer. See, e.g., FIGS. 8A and 8B.

At 1312, the workpiece carrier is transferred to the storage buffer from the second OHT vehicle. See, e.g., FIG. 9.

At 1314, the workpiece carrier is transferred to a third OHT vehicle by extending a gripper of the third OHT vehicle over the storage buffer, where the third OHT vehicle is configured to move along the first track(s). See, e.g., FIG. 10. In some embodiments, the first and third OHT vehicles are the same.

At 1316, the third OHT vehicle moves along the first track(s) to a loading port of a second process and/or inspection tool. See, e.g., FIGS. 11A and 11B.

At 1318, the workpiece carrier is transferred to the loading port of the second process and/or inspection tool from the third OHT vehicle. See, e.g., FIG. 12.

While the method described by the flowchart 1300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides a transport system for semiconductor workpieces. A first vehicle is configured to travel on, and move a semiconductor workpiece along, a first rail. A second vehicle is configured to travel on, and move the semiconductor workpiece along, a second rail overlying the first rail.

A controller is configured to control the first and second vehicles to transfer the semiconductor workpiece along the first and second rails, between process or inspection tools.

In other embodiments, the present disclosure provides a method for transporting semiconductor workpieces. A semiconductor workpiece is transferred into a first vehicle from a first process or inspection tool. The first vehicle is configured to travel on a first rail. The semiconductor workpiece moves along the first rail with the first vehicle. The semiconductor workpiece is transferred from the first vehicle to a second vehicle configured to travel on a second rail overlying the first rail. The semiconductor workpiece moves along the second rail with the second vehicle. The semiconductor workpiece is transferred out of the second vehicle to a second process or inspection tool.

In yet other embodiments, the present disclosure provides a transport system for semiconductor workpieces. A storage buffer is configured to store a workpiece carrier. A first vehicle is configured to travel on, and move the workpiece carrier below, one or more first rails arranged over and laterally offset from the storage buffer. A second vehicle is configured to travel on, and move the workpiece carrier below, a second rail. The second rail is arranged over the one or more first rails and laterally offset from the one or more first rails, and the second rail is arranged directly over the storage buffer. A controller is configured to control the first and second vehicles to transfer the workpiece carrier along the first and second rails, between process or inspection tools.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transport system for semiconductor workpieces, the transport system comprising:
    a first rail, wherein the first rail is a loop;
    a first vehicle configured to travel on, and move a semiconductor workpiece along, the first rail while under the first rail, wherein the first vehicle comprises a mechanical arm;
    a storage buffer spaced below the first rail, wherein the storage buffer is a loop, wherein the first vehicle is configured to laterally extend the semiconductor workpiece to a location directly over the storage buffer from a location laterally spaced from the storage buffer with the mechanical arm;
    a second rail spaced above the first rail, wherein the second rail is a loop, wherein the first rail extends laterally to completely enclose the second rail and the storage buffer while remaining laterally spaced from the second rail and the storage buffer;
    a second vehicle configured to travel on, and move the semiconductor workpiece along, the second rail; and
    a controller configured to control the first and second vehicles to transfer the semiconductor workpiece along the first and second rails, between process or inspection tools.

2. The transport system according to claim 1, wherein the first or second vehicle is configured to extend and retract a gripper in a direction orthogonal to an upper surface of the first rail to move a semiconductor workpiece respectively out of and into the first or second vehicle.

3. The transport system according to claim 1, wherein the storage buffer is a conveyor belt directly under the second rail and laterally enclosed by the first rail, and wherein the conveyer belt is configured to store the semiconductor workpiece while moving the semiconductor workpiece.

4. The transport system according to claim 1, wherein the first vehicle is configured to move the semiconductor workpiece out of the first vehicle by:
    laterally extending a gripper while latched to the semiconductor workpiece;
    releasing the semiconductor workpiece with the gripper; and
    retracting the gripper into the first vehicle without the semiconductor workpiece.

5. The transport system according to claim 1, wherein the first vehicle is configured to move a workpiece carrier into the first vehicle by:
    laterally extending a gripper to a location overlying the workpiece carrier;
    latching onto the workpiece carrier with the gripper; and
    retracting the gripper into the first vehicle while latched to the workpiece carrier.

6. The transport system according to claim 1, wherein the first or second vehicle is an overhead transport (OHT) vehicle.

7. The transport system according to claim 1, wherein the first rail is vertically spaced completely between the second rail and the storage buffer.

8. The transport system according to claim 1, wherein the first vehicle is configured to move continuously in a loop along the first rail without stopping to change direction.

9. A method for transporting semiconductor workpieces, the method comprising:
    transferring a semiconductor workpiece into a first vehicle from a first process or inspection tool with a first gripper of the first vehicle, the first vehicle configured to travel on a first rail, and wherein the first rail is a loop;
    moving the semiconductor workpiece along the first rail with the first vehicle;
    transferring the semiconductor workpiece from the first vehicle to a second vehicle with a second gripper of the second vehicle, the second vehicle configured to travel on a second rail spaced over the first rail, wherein the second rail is a loop and is non-overlapping with the first rail, and wherein the transferring of the semiconductor workpiece from the first vehicle to the second vehicle comprises:
        transferring the semiconductor workpiece directly to a storage buffer from the first vehicle, wherein the transferring of the semiconductor workpiece directly to the storage buffer from the first vehicle comprises laterally extending the semiconductor workpiece out from the first vehicle to directly over the storage buffer; and
        lowering the second gripper to the storage buffer while the second gripper is suspended from the second vehicle, wherein the storage buffer is directly under the second rail and is spaced below the first rail;
    moving the semiconductor workpiece along the second rail with the second vehicle; and transferring the semiconductor workpiece out of the second vehicle to a second process or inspection tool with the second gripper.

10. The method according to claim 9, wherein the transferring of the semiconductor workpiece from the first vehicle to the second vehicle comprises:
   laterally extending the first gripper of the first vehicle to a location overlying the storage buffer while the semiconductor workpiece is latched to the gripper, where the first gripper is extended to the location with an arm of the first vehicle;
   releasing the semiconductor workpiece from the first gripper of the first vehicle; and
   retracting the first gripper of the first vehicle into the first vehicle without the semiconductor workpiece, wherein the retracting of the first gripper into the first vehicle is performed with the arm.

11. The method according to claim 10, wherein the transferring of the semiconductor workpiece from the first vehicle to the second vehicle further comprises:
   lowering the second gripper of the second vehicle onto the semiconductor workpiece with cables;
   latching onto the semiconductor workpiece with the second gripper of the second vehicle; and
   retracting the second gripper of the second vehicle into the second vehicle while the second gripper of the second vehicle is latched onto the semiconductor workpiece, wherein the retracting of the second gripper of the second vehicle into the second vehicle is performed with the cables.

12. The method according to claim 9, wherein the transferring of the semiconductor workpiece from the first vehicle to the second vehicle comprises:
   moving the semiconductor workpiece to a location on the storage buffer with the first gripper and an arm of the first vehicle; and
   raising the semiconductor workpiece to a location overlying the first rail with the second gripper and cables of the second vehicle.

13. The method according to claim 9, wherein the transferring of the semiconductor workpiece out of the second vehicle comprises:
   lowering the second gripper of the second vehicle to the storage buffer under the first rail while the second gripper of the second vehicle is latched onto the semiconductor workpiece, wherein the lowering of the second gripper is performed by cables of the second vehicle;
   releasing the semiconductor workpiece on the storage buffer with the second gripper of the second vehicle; and
   retracting the second gripper of the second vehicle into the second vehicle without the semiconductor workpiece, wherein the retracting of the second gripper into the second vehicle is performed with the cables of the second vehicle.

14. The method according to claim 13, wherein the transferring of the semiconductor workpiece out of the second vehicle further comprises:
   laterally extending a third gripper of a third vehicle to a location overlying the semiconductor workpiece, wherein the third vehicle is configured to travel on the first rail, and wherein the third gripper is laterally extended to the location with an arm of the third vehicle;
   latching onto the semiconductor workpiece with the third gripper of the third vehicle; and
   retracting the third gripper of the third vehicle into the third vehicle while the gripper of the third vehicle is latched onto the semiconductor workpiece, wherein the retracting of the third gripper into the third vehicle is performed with the arm.

15. The method according to claim 9, wherein an elevation of the semiconductor workpiece above the storage buffer is the same upon completion of the transferring of the semiconductor workpiece directly to the storage buffer from the first vehicle as during the moving of the semiconductor workpiece along the first rail.

16. A transport system for semiconductor workpieces, the transport system comprising:
   a storage buffer configured to store a workpiece carrier;
   one or more first rails, wherein each of the one or more first rails is a loop;
   a first vehicle configured to travel on, and move the workpiece carrier below, the one or more first rails arranged over and laterally offset from the storage buffer, wherein the first vehicle is configured to move along the one or more first rails in a curved path;
   a second rail vertically spaced over the one or more first rails, wherein the second rail is a loop and completely overlies the storage buffer, wherein each of the one or more first rails is vertically spaced completely between the second rail and the storage buffer, and wherein the one or more first rails each extend laterally to completely enclose the storage buffer and the second rail while remaining laterally spaced from the second rail and the storage buffer;
   a second vehicle configured to travel on, and move the workpiece carrier below, the second rail, wherein the second vehicle is further configured to lower the workpiece carrier to a location below the one or more first rails while the workpiece carrier is suspended from the second vehicle; and
   a controller configured to control the first and second vehicles to transfer the workpiece carrier along the first and second rails, between process or inspection tools.

17. The transport system according to claim 16, wherein the first vehicle is configured to move the workpiece carrier out of the first vehicle by laterally extending a gripper while attached to the workpiece carrier, releasing the workpiece carrier on the storage buffer, and retracting the gripper into the first vehicle without the workpiece carrier.

18. The transport system according to claim 16, wherein the storage buffer is a conveyor belt extending laterally in a loop.

19. The transport system according to claim 16, wherein the one or more first rails comprise an inner rail and an outer rail, wherein the inner and outer rails are coplanar and interconnected by a bridge extending laterally from a first sidewall of the inner rail to a second sidewall of the outer rail, and wherein bridge is angled at less than 90 degrees relative to the first and second sidewalls.

20. The transport system according to claim 16, wherein the one or more first rails comprise an inner rail and an outer rail, wherein the inner rail, the outer rail, and the second rail each has a top layout that is square ring-shaped with rounded corners, wherein the inner rail comprises a first line-shaped segment and a second line-shaped segment orthogonal to the first line-shaped segment, wherein the second rail comprises a third line-shaped segment and a fourth line-shaped segment orthogonal to the third line-shaped segment, wherein the first and third line-shaped segments are parallel and are laterally spaced by a first distance, and wherein the second and fourth line-shaped segments are parallel and are laterally spaced by a second distance that is the same as the first distance.

\* \* \* \* \*